(12) United States Patent
Deak et al.

(10) Patent No.: US 9,234,948 B2
(45) Date of Patent: Jan. 12, 2016

(54) SINGLE-PACKAGE BRIDGE-TYPE MAGNETIC FIELD SENSOR

(75) Inventors: James Geza Deak, Zhangjiagang (CN); Insik Jin, Zhangjiagang (CN); Xiaofeng Lei, Zhangjiagang (CN); Weifeng Shen, Zhangjiagang (CN); Songsheng Xue, Zhangjiagang (CN); Xiaojun Zhang, Zhangjiagang (CN)

(73) Assignee: MultiDimension Technology Co., Ltd. (CN)

( * ) Notice: Subject to any disclaimer, the term of this patent is extended or adjusted under 35 U.S.C. 154(b) by 113 days.

(21) Appl. No.: 13/979,721

(22) PCT Filed: Dec. 31, 2011

(86) PCT No.: PCT/CN2011/085124
§ 371 (c)(1),
(2), (4) Date: Jul. 15, 2013

(87) PCT Pub. No.: WO2012/097673
PCT Pub. Date: Jul. 26, 2012

(65) Prior Publication Data
US 2013/0300409 A1 Nov. 14, 2013

(30) Foreign Application Priority Data

Jan. 17, 2011 (CN) .......................... 2011 1 0008762
May 27, 2011 (CN) .......................... 2011 1 0141214

(51) Int. Cl.
*G01R 33/02* (2006.01)
*G01R 33/09* (2006.01)

(52) U.S. Cl.
CPC ............ *G01R 33/093* (2013.01); *G01R 33/098* (2013.01)

(58) Field of Classification Search
CPC ....................................... G01R 33/09–33/098
USPC ............... 324/207.21, 252, 207.25; 338/32 R
See application file for complete search history.

(56) References Cited

U.S. PATENT DOCUMENTS

| 7,639,005 B2 * | 12/2009 | Qian et al. ..................... 324/252 |
| 2002/0180433 A1 * | 12/2002 | Van Zon et al. ............... 324/252 |
| 2006/0164076 A1 * | 7/2006 | Hinz et al. ................ 324/207.21 |
| 2008/0012558 A1 * | 1/2008 | Rossler et al. ................. 324/252 |
| 2008/0211490 A1 * | 9/2008 | Kurata et al. ............ 324/207.21 |
| 2009/0045809 A1 * | 2/2009 | Kasajima et al. ............. 324/252 |
| 2010/0127696 A1 * | 5/2010 | Huber et al. ............. 324/207.21 |
| 2010/0253330 A1 * | 10/2010 | Sasaki et al. .................. 324/252 |
| 2012/0068698 A1 * | 3/2012 | Chen et al. .................... 324/252 |

* cited by examiner

*Primary Examiner* — Arleen M Vazquez
*Assistant Examiner* — Lee Rodak
(74) *Attorney, Agent, or Firm* — Schwegman Lundberg & Woessner, P.A.

(57) ABSTRACT

A magnetoresistive sensor bridge utilizing magnetic tunnel junctions is disclosed. The magnetoresistive sensor bridge is composed of one or more magnetic tunnel junction sensor chips to provide a half-bridge or full bridge sensor in a standard semiconductor package. The sensor chips may be arranged such that the pinned layers of the different chips are mutually anti-parallel to each other in order to form a push-pull bridge structure. The sensor chips are then interconnected using wire bonding. The chips can be wire-bonded to various standard semiconductor leadframes and packaged in inexpensive standard semiconductor packages. The bridge design may be push-pull or referenced. In the referenced case, the on-chip reference resistors may be implemented without magnetic shielding.

10 Claims, 7 Drawing Sheets

SINGLE-PACKAGE BRIDGE-TYPE MAGNETIC FIELD SENSOR

CROSS-REFERENCE TO RELATED APPLICATIONS

This application is a 35 U.S.C. §371 national phase application of PCT/CN2011/085124, filed on Dec. 31, 2011, which claims priorities to a Chinese Patent Application No. 201110141214.7, filed on May 27, 2011, and a Chinese Patent Application No. 201110008762.2, filed on Jan. 17, 2011 incorporated herein by reference in their entireties.

FIELD OF THE INVENTION

The present invention relates to the field of magnetic field measurement using a magnetic tunnel junction (MTJ, Magnetic Tunnel Junction) or giant magnetoresistance (GMR Giant Magnetoresistance) device, in particular, relates to the integration of MTJ or GMR chips into a standard semiconductor package.

BACKGROUND ART

Magnetic sensors are widely used in modern systems to measure or detect physical parameters including but not limited to magnetic field strength, current, position, motion, orientation, and so forth. There are many different types of sensors in the prior art for measuring magnetic field and other parameters. However, they all suffer from various limitations well known in the art, for example, excessive size, inadequate, inadequate sensitivity and/or dynamic range, cost, reliability and other factors. Thus, there continues to be a need for improved magnetic sensors, especially sensors that can be easily integrated with semiconductor devices and integrated circuits and manufacturing methods thereof.

Magnetic tunnel junction (MTJ) sensors have the advantages of high sensitivity, small size, low cost, and low power consumption. Although MTJ devices are compatible with standard semiconductor fabrication processes, methods for building high sensitivity devices with sufficient yield for low cost mass production have not been adequately developed. In particular, yield issues due to difficulty in MTJ process and backend packaging process, and difficulty in matching the magnetoresistive response of MTJ elements when combined to form bridge sensors have proven difficult.

SUMMARY OF THE INVENTION

The purpose of the present invention is to provide a process for preparing a high-performance multi-chip, push-pull bridge linear magnetoresistive sensor in a standard semiconductor package utilizing MTJ or GMR sensor chips and standard semiconductor fabrication processes. In order to achieve the above stated goals, one aspect of the present invention is to provide an single package bridge-type magnetic field sensor, comprising one or more pairs MTJ or GMR magnetoresistive sensor chips, wherein the sensor chips are fixed on a die attach area of a standard semiconductor package, and each sensor chip includes a fixed resistance value reference resistor and a sensing resistor that changes in response to an external magnetic field. Both the reference resistor and the sensing resistor include a plurality of interconnected MTJ or GMR sensor elements in the form of an array.

Additionally, each of the reference resistor and the sensing resistor is magnetically biased using a strip-shaped permanent magnet, sitting between the columns in the sensor arrays. The resistance value of the sensing resistor depends linearly on the external magnetic field. The sensor chips include bond pad used to electrically connect the sensor chips to the die attach area and adjacent sensor chip using a plurality of bonding lines in order to constitute a bridge sensor. The sensor chips and a leadframe are encapsulated to form a standard semiconductor package.

Another aspect of the present invention is to provide a single package bridge-type magnetic field sensor, the sensor comprises one or more pairs of MTJ or GMR magnetoresistive sensor chips, wherein the sensor chips are fixed onto a die attach area of a standard semiconductor package; each sensor chip includes a fixed reference resistor and a sensing resistor that responds to an external magnetic field; each of the reference and the sensing resistors comprises a plurality of MTJ or GMR magnetoresistive elements, wherein the MTJ or GMR magnetoresistive elements are arranged in a matrix and interconnected to form a single magnetoresistive element; the resistance of the sensing resistor is linearly proportional to the external magnetic field; the sensor chips include bond pads so that each pin of the magnetoresistance elements can be connected to a bonding wire; the bonding wires are used to interconnect the sensor chips and to connect the sensor chips to the die attach area in order to enable the fabrication of a bridge sensor. A leadframe and the sensor chips are encapsulated in plastic to form a standard semiconductor package.

Compared with the prior art, the present invention is advantageous: it describes a method for manufacturing a linear high-performance magnetoresistive sensor that is easy to manufacture, low cost, and suitable for mass production.

DESCRIPTION OF THE PREFERRED EMBODIMENTS

These sensor elements are configured as spin valves, where one of the magnetic layers has a magnetization with an orientation that is fixed in order to serve as a reference. This fixed layer can be a single magnetic layer or a synthetic antiferromagnetic structure composed of a pinned ferromagnetic layer exchange coupled to a reference ferromagnetic layer, wherein the pinned ferromagnetic layer is made magnetically insensitive by exchange coupling it to an antiferromagnetic layer. The other magnetic layer, the so called free layer, rotates in response to an applied magnetic field. The resistance of the spin valve varies in proportion to the relative difference in the orientation of the magnetization of the free and pinned ferromagnetic layers. Because the free layer rotates in response to the applied magnetic field, the sensor is sensitive to the applied magnetic field. In a MTJ element, the free layer and fixed layer are separated by a tunnel barrier. Electrical current flows through the tunnel barrier. In a GMR element, the free layer and the pinned layer are separated by a non-magnetic metallic layer. Electrical current can flow either in the plane of the multilayer thin film or perpendicular to the plane.

Figure 1:
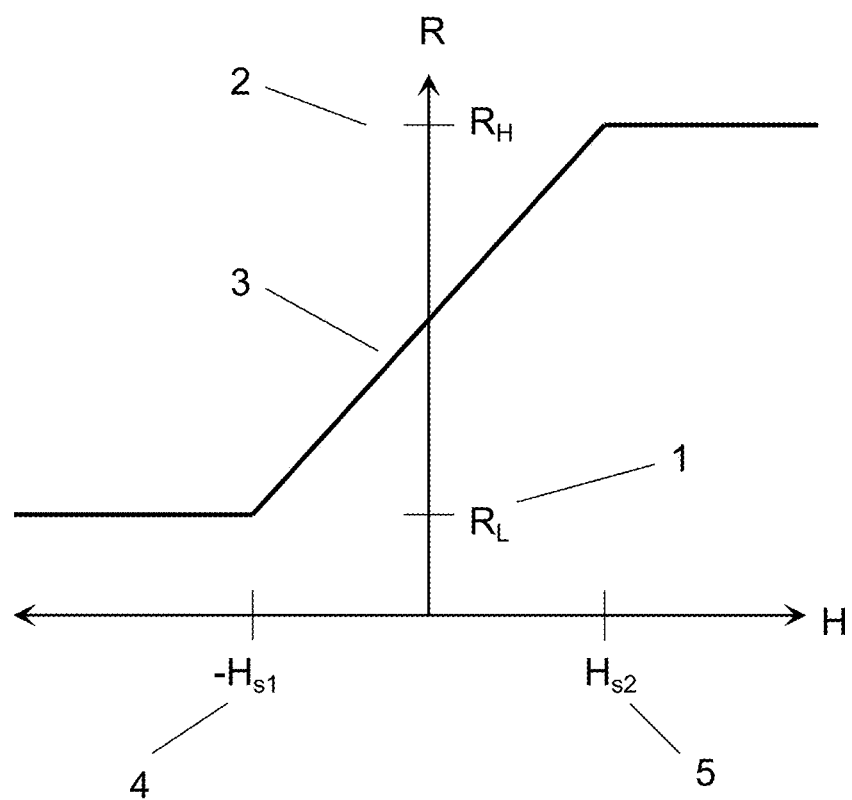
FIG. 1—A schematic drawing of the magnetoresistive response of a spin-valve sensing element with the reference layer magnetization pointing in the negative H direction.

The general form of the magnetoresistive transfer curve of a GMR or MTJ magnetic sensor element suitable for linear magnetic field measurement is shown schematically in FIG. 1. The transfer curve depicted in the figures saturates at low 1 and high 2, resistance values, $R_L$ and $R_H$, respectively. In the region between saturation, the transfer curve is linearly dependent on the applied magnetic field, H. In non-ideal cases, the transfer curves is not symmetric about the H=0 point in the plot. The saturation fields 4 and 5 are typically offset by an amount that is determined by the interlayer coupling between the free layer and the pinned layer. A major contributor to the interlayer coupling, so called Neel coupling or "orange-peel" coupling, is related to roughness of the ferromagnetic films within the GMR and MTJ structures, and it is dependent on materials and manufacturing processes.

Between the saturation fields, 4 and 5, is the operation field region where ideally the response of the MTJ or GMR resistance is linear. Sensitivity of the MTJ element, the slope 3 of the transfer curve in FIG. 1, depends upon the stiffness of the free layer in response to the applied magnetic field. The slope 3 can be tuned by the shape of the MTJ element, to achieve the field sensitivity for specific designs and purposes. Usually MTJ element is pattern into an elongated shape such as but not limited to ellipse, rectangle, and diamond, oriented orthogonally with respect to the pinned layer. In some cases, the free layer can be biased or stabilized by a permanent magnet in the direction perpendicular to the pinning layer. In some cases for high field sensitivity, magnetic field concentrators, or flux guides, can be integrated in the magnetic field sensor to amplify the magnetic field on the free layer of the MTJ elements.

Figure 2:
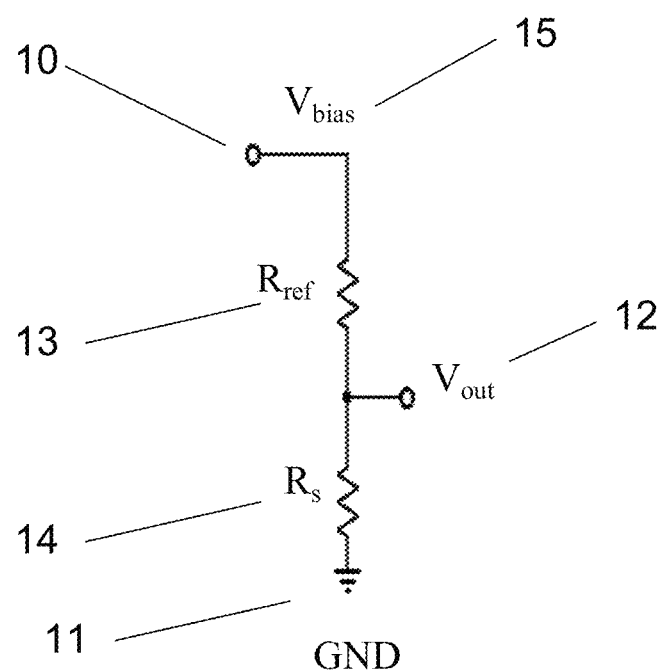
FIG. 2—A schematic drawing of a half-bridge with a fixed reference resistor and a sensing resistor.

FIG. 2 shows the schematic of a half-bridge configuration 10 with a bias voltage 15 on a series of a reference resistor 13 with a fixed resistance and a sensing resistor 14 of which the resistance responds to the applied magnetic field. The output voltage 12 is then the voltage difference across the sensing resistor.

Figure 3:
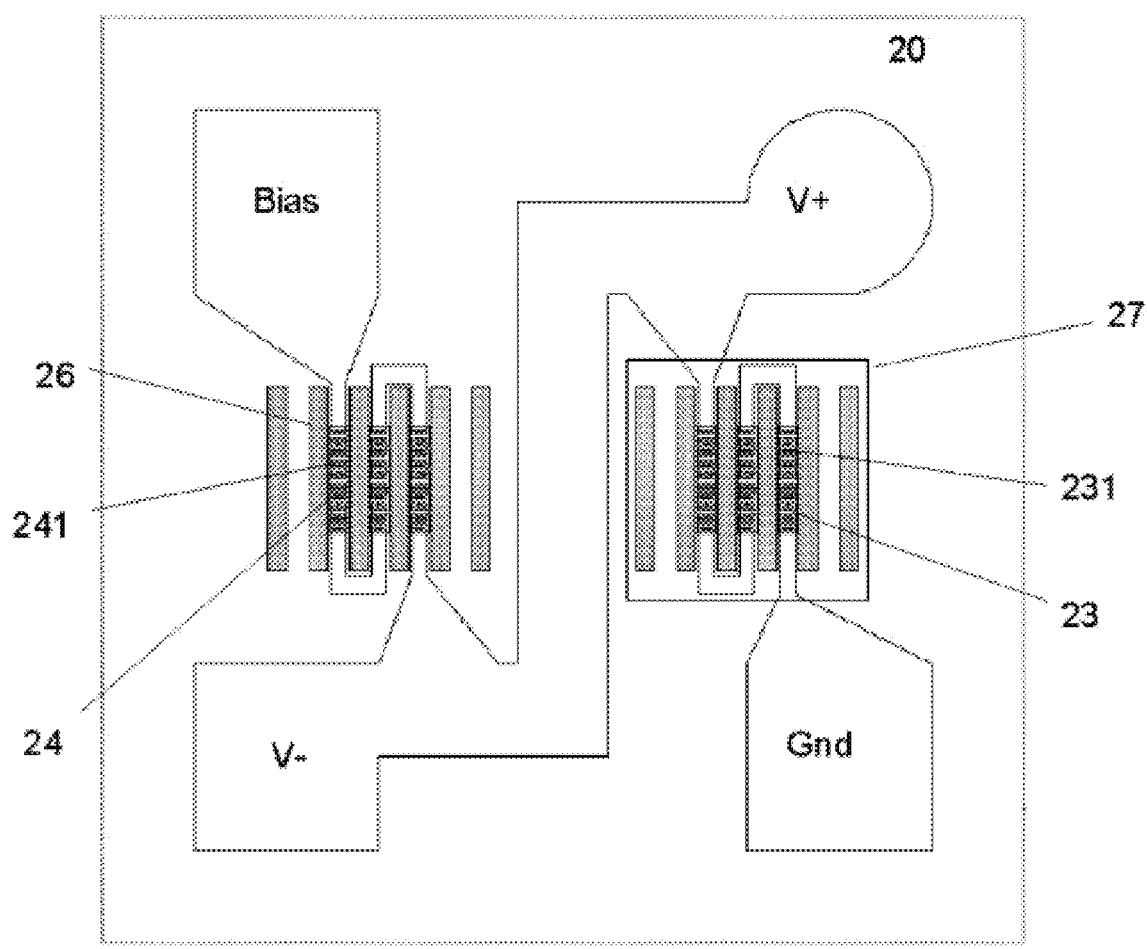
FIG. 3—An embodiment of a half-bridge in a magnetoresistive sensor chip where both reference resistor and sensing resistor made of plural MTJ elements arranged in row arrays and bar-shape permanent magnets are used to bias the MTJ elements.

FIG. 3 shows a design of a half-bridge in a magnetoresistive chip 20. Both reference resistor 23 and sensing resistor 24 are composed of a plurality of MTJ elements, 231, and 241, respectively, which are arranged several columns. MTJ elements are connected in series to form the reference resistor and sensing resistor. In between the MTJ element columns there are bar-shaped permanent magnets 26 (PM) to bias the MTJ free layers in the direction perpendicular to the pinned layer. In this case, the PM bars are oriented in the pinned layer magnetization direction. In chip fabrication, the PM's must be magnetized in the direction perpendicular to the pinned layer in order to provide stabilization field for the free layers. The PM's are not necessarily fabricated in the same plane of the MTJs. However, they should be close to provide sufficient bias field strength. Since the reference resistor should not be sensitive to the applied magnetic field, the reference MTJ elements 231 can be with different shape and/or different shape aspect ratio from the sensing MTJ element 241 in order to obtain shape anisotropy and magnetic stiffness against applied field. Alternatively, a magnetic shield 27 can be integrated in the chip to screen magnetic field/flux for the reference MTJ elements. In general, the magnetic shield is a piece of soft magnet placed on top of the reference MTJ elements, covering all the elements so that it shields the magnetic field from the elements and the fringe field of the shield at the edges will not affect the MTJ elements.

Figure 4:
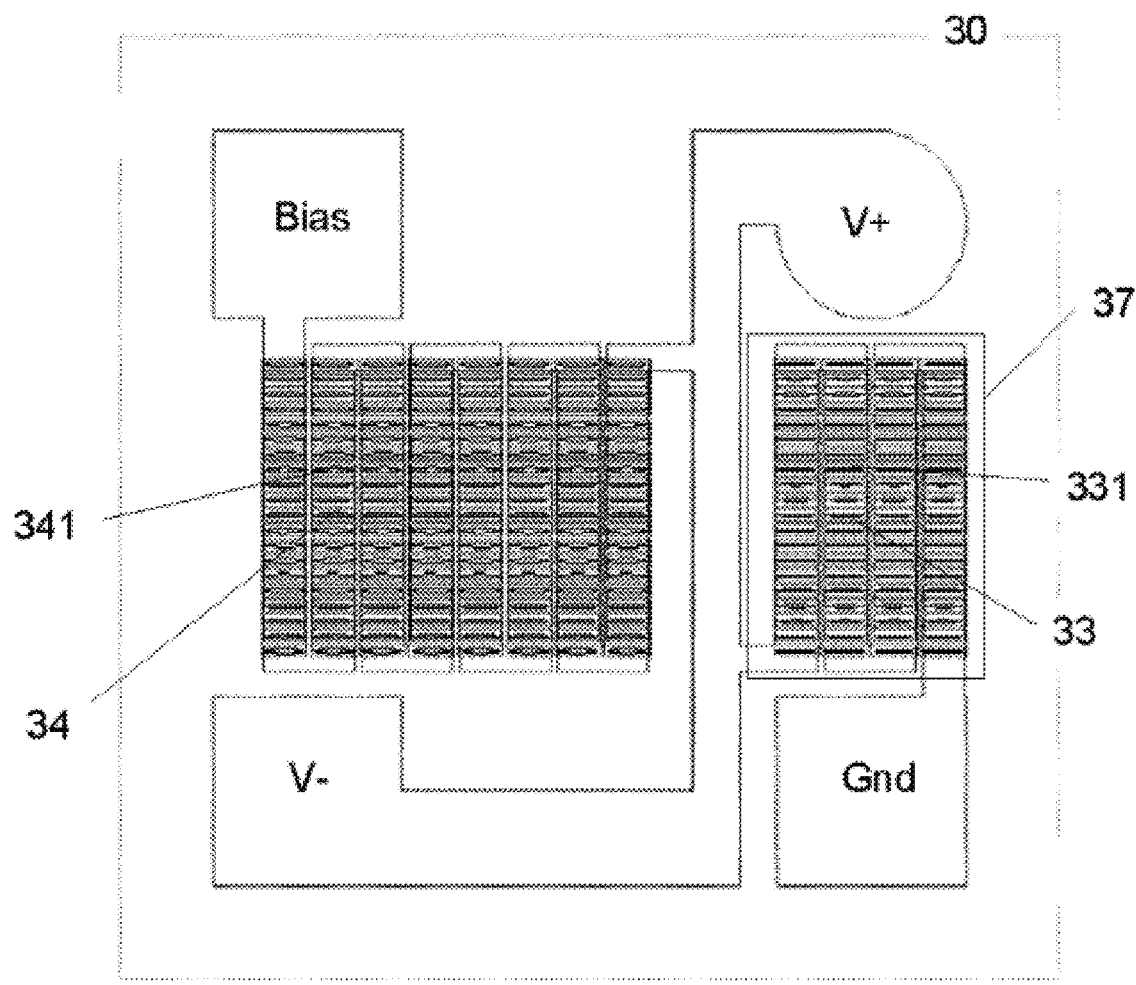
FIG. 4—An embodiment of a half-bridge in a magnetoresistive sensor chip where both reference resistor and sensing resistor made of plural MTJ elements arranged in matrices.

FIG. 4 shows a second design of a half-bridge in a magnetoresistive chip 30. Both reference resistor 33 and sensing resistor 34 comprise a plurality of MTJ elements, 331, and 341, respectively, which are arranged in matrix configuration to achieve large area utilization. MTJ elements are connected in series for both the reference resistor and sensing resistor. Since the reference resistor should not be sensitive to the applied magnetic field, the reference MTJ elements 331 can be with different shape and/or difference shape aspect ratio from the sensing MTJ element 341 to obtain shape anisotropy and magnetic stiffness against applied field. Alternatively, a magnetic shield 37 can be integrated in the chip to screen magnetic field/flux for the reference MTJ elements. In general, the shield is a piece of soft magnet placed on top of the reference MTJ elements, covering all the elements so that it shield the magnetic field from the elements and the fringe field of the shield at the edges will not affect the MTJ elements.

Figure 5:
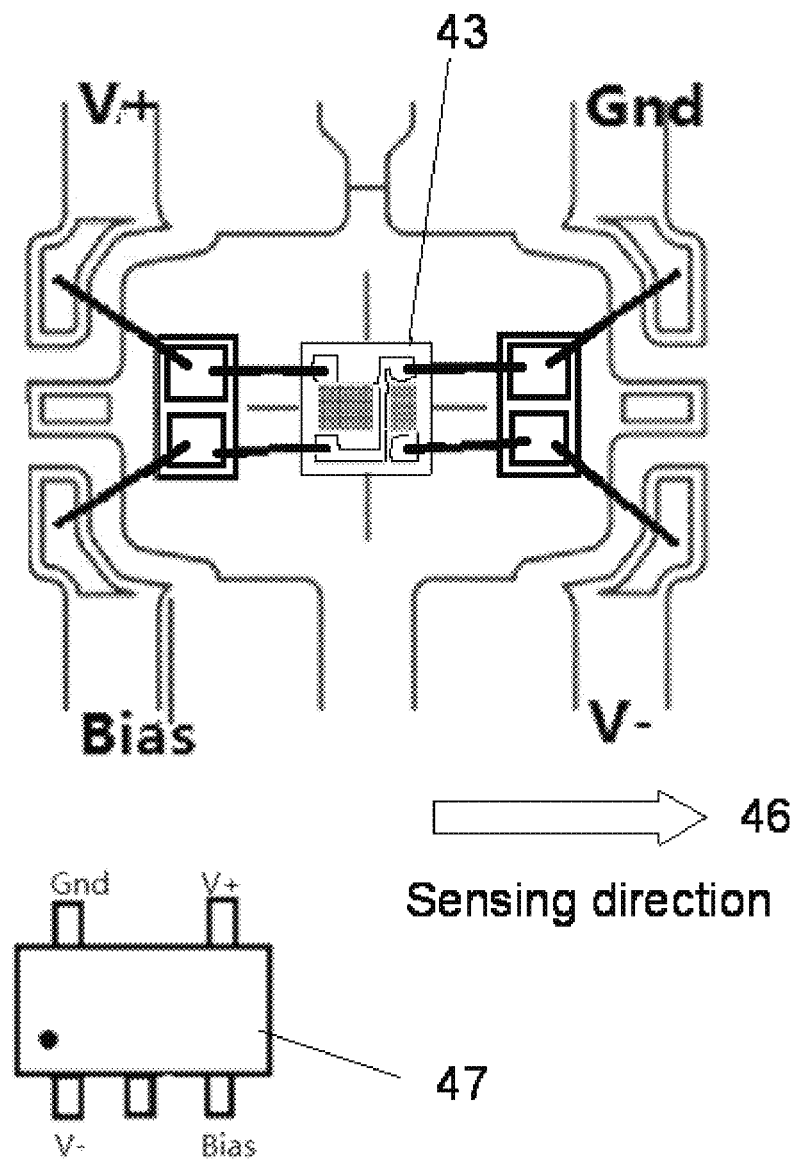
FIG. 5—A drawing of half-bridge magnetoresistive sensor chip placed within a standard semiconductor package.

FIG. 5 is a drawing of a half-bridge magnetoresistive chip 43 placed and connected in a standard semiconductor package. Wire bonding technique is used for the connection. The magnetoresistive sensor chips are wire bonded to each other and the leadframe. The half-bridge chip can be one of the above embodiments in FIGS. 3 and 4. The field sensing direction 46 is also shown with respect to the package orientation 47.

Figure 6:
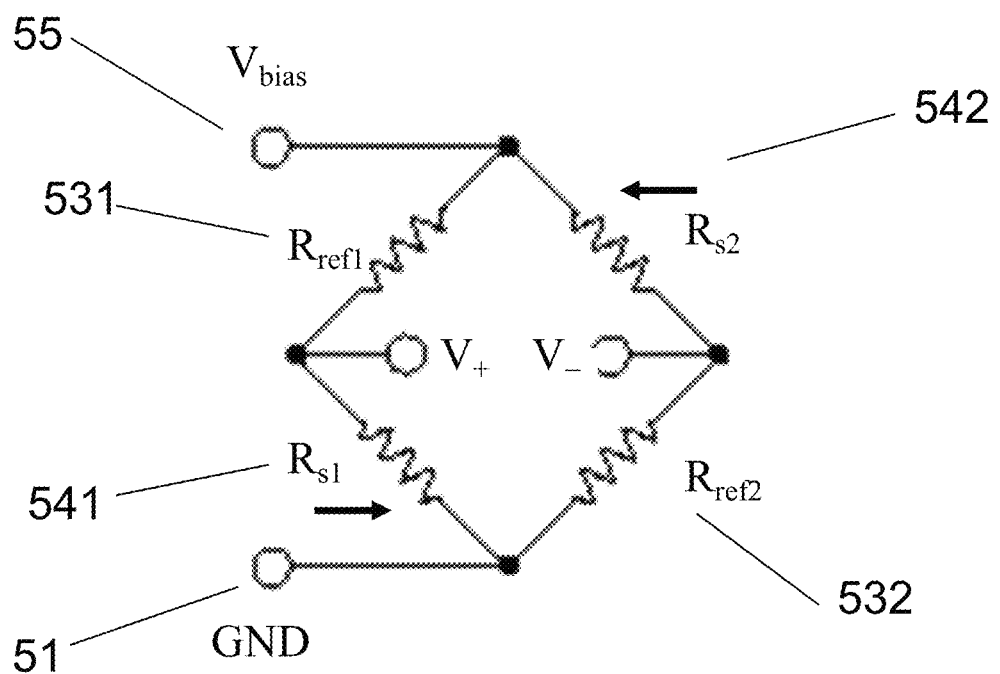
FIG. 6—A schematic drawing of a full-bridge sensor.

FIG. 6 shows the schematic of a full-bridge 50 that is essentially two half bridges, one of includes reference resistor $R_{ref1}$ 531 and sense resistor $R_{s1}$ 541, and the other includes reference resistor $R_{ref2}$ 532, and sense resistor $R_{s2}$ 542, connected in parallel between $V_{bias}$ 55 and GND 51. The output is the voltage difference between $V_+$ and $V_-$.

Figure 7:
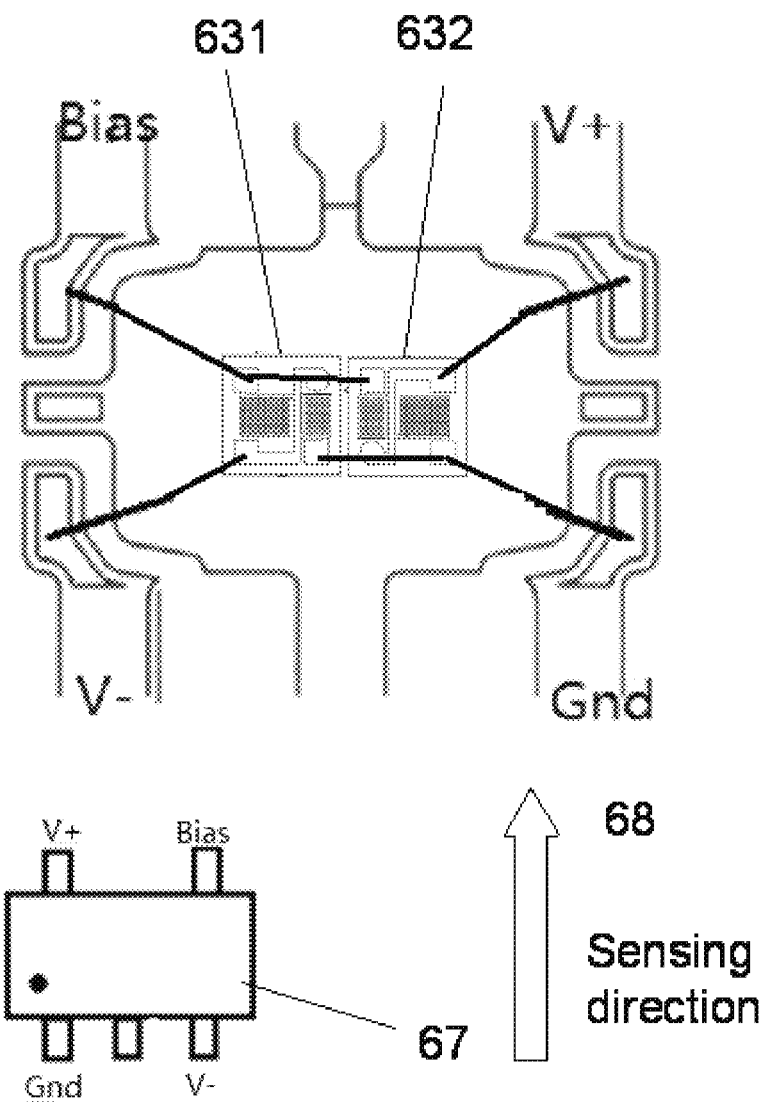
FIG. 7—A drawing of a full-bridge sensor with two half-bridge magnetoresistive sensor chips placed within a standard semiconductor package.

FIG. 7 is a drawing of a full-bridge sensor composed of two electrically interconnected magnetoresistive chips 631 and 632 placed in a standard semiconductor package. Wire bonding technique is used to make the electrical connections. The magnetoresistive sensor chips are wire bonded to each other and a die attach area. The type of the two magnetoresistive chips can be one of the above embodiments in FIGS. 3 and 4. The field sensing direction 68 is also shown with respect to the package orientation 67. In this full-bridge sensor embodiment, the two magnetoresistive chips are oriented opposite to each other so that the response of the sensing resistors to applied magnetic field is opposite in polarity. Since the resistance of the reference resistors and of the sensing resistors in zero field should match each other well, all the MTJ elements will be completed in the same fabrication process. Furthermore, the shape and/or shape aspect ratio of the MTJ elements for reference resistor and for sensing resistor can only be adjusted under the constraint for resistance matching.

A push-pull full bridge sensor can provide higher sensitivity and larger output voltage than a conventional full bridge sensor. Instead of having two reference resistors with fixed resistance, the push-pull full bridge is configured in the way that all the four resistors respond to the applied magnetic field.

It will be apparent to those skilled in the art that various modifications can be made to the proposed invention without departing from the scope or spirit of the invention. Further, it is intended that the present invention cover modifications and variations of the present invention provided that such modifications and variations come within the scope of the appended claims and their equivalence.

The invention claimed is:

1. A single-package bridge-type magnetic field sensor, comprising:
   one or more pairs of MTJ or GMR magnetoresistive sensor chips, wherein the sensor chips are adhered to a die attach area of a standard semiconductor package;
   wherein each sensor chip includes a reference resistor with a fixed resistance and a sensing resistor with a resistance varying in response to a magnetic field;
   wherein each reference and sensing resistor includes a plurality of MTJ or GMR magnetoresistive elements electrically interconnected as a single magnetoresistive element, each reference and sensing resistor including columns of magnetoresistive elements electrically interconnected in series where adjacent magnetoresistive elements in each column are directly connected in series and bar-shaped permanent magnets between columns in order to bias the magnetoresistive elements; and
   wherein the sensing resistor has a transfer curve that is linearly proportional to an applied magnetic field in an operating magnetic field range.

2. A single-package bridge-type magnetic field sensor as in claim 1, wherein the sensor is a half-bridge sensor comprising one sensor chip.

3. A single-package bridge-type magnetic field sensor as in claim 1, wherein the sensor is a full-bridge sensor comprising a pair of sensor chips, wherein one of the pair of sensor chips is rotated 180 degrees with respect to the other.

4. A single-package bridge-type magnetic field sensor as in claim 3, wherein the sensor chips include reference resistors and sensing resistors with matched resistance.

5. A single-package bridge-type magnetic field sensor as in claim 1, wherein the magnetoresistive elements are patterned in a strip-like shape.

6. A single-package bridge-type magnetic field sensor as in claim 1, wherein the magnetoresistive elements of the reference resistor are patterned in a different shape aspect ratio from that of the magnetoresistive elements of the sensing resistor.

7. A single-package bridge-type magnetic field sensor as in claim 1, wherein the reference resistor is screened from an applied magnetic field by one or more magnetic shields.

8. A single-package bridge-type magnetic field sensor as in claim 1, wherein the sensor comprises a plurality of bond pads wherein more than one wire bond may be attached to each side of the magnetoresistive elements.

9. A single-package bridge-type magnetic field sensor as in claim 1, wherein the magnetoresistive sensor chips are wire bonded to each other and a leadframe in order to produce a bridge sensor.

10. A single-package bridge-type magnetic field sensor as in claim 9, wherein the leadframe and sensor chips are encapsulated in plastic to form a standard semiconductor package.

* * * * *